United States Patent
Yamada et al.

(10) Patent No.: US 8,472,140 B2
(45) Date of Patent: Jun. 25, 2013

(54) SPIN OSCILLATOR OR MAGNETIC RECORDER INCLUDING MULTIPLE INJECTION LAYERS IN THE MAGNETIC RECORDING HEAD

(75) Inventors: Kenichiro Yamada, Minato-ku (JP);
Hitoshi Iwasaki, Yokosuka (JP);
Masayuki Takagishi, Kunitachi (JP);
Tomomi Funayama, Fuchu (JP);
Masahiro Takashita, Yokohama (JP);
Katsuhiko Koui, Yokohama (JP);
Mariko Kitazaki, Yokohama (JP);
Soichi Oikawa, Hachioji (JP)

(73) Assignee: Kabushiki Kaisha Toshiba, Tokyo (JP)

(*) Notice: Subject to any disclaimer, the term of this patent is extended or adjusted under 35 U.S.C. 154(b) by 0 days.

(21) Appl. No.: 13/404,046

(22) Filed: Feb. 24, 2012

(65) Prior Publication Data
US 2012/0154952 A1   Jun. 21, 2012

Related U.S. Application Data

(63) Continuation of application No. PCT/JP2009/004355, filed on Sep. 3, 2009.

(51) Int. Cl.
*G11B 5/147* (2006.01)
(52) U.S. Cl.
USPC ..................................................... 360/125.3
(58) Field of Classification Search
USPC ............... 360/125.12, 125.3, 125.31, 324.1
See application file for complete search history.

(56) References Cited

U.S. PATENT DOCUMENTS

| | | | |
|---|---|---|---|
| 6,011,664 A | 1/2000 | Kryder et al. | |
| 7,230,265 B2 | 6/2007 | Kaiser et al. | |
| 7,616,412 B2 * | 11/2009 | Zhu et al. | 360/324.2 |
| 7,663,197 B2 * | 2/2010 | Nagase et al. | 257/421 |
| 7,957,098 B2 | 6/2011 | Yamada et al. | |
| 7,965,474 B2 * | 6/2011 | Sato et al. | 360/324.12 |
| 8,164,854 B2 * | 4/2012 | Takagishi et al. | 360/125.31 |
| 8,264,799 B2 * | 9/2012 | Akiyama et al. | 360/324.1 |
| 2005/0023938 A1 | 2/2005 | Sato et al. | |
| 2005/0219771 A1 | 10/2005 | Sato et al. | |
| 2008/0019040 A1 | 1/2008 | Zhu et al. | |
| 2009/0180308 A1 * | 7/2009 | Inomata et al. | 365/145 |
| 2009/0225465 A1 * | 9/2009 | Iwasaki et al. | 360/75 |
| 2012/0176702 A1 * | 7/2012 | Yamada et al. | 360/244 |

FOREIGN PATENT DOCUMENTS

JP   2009-70541   4/2009

OTHER PUBLICATIONS

International Search Report mailed Dec. 15, 2009 in PCT/JP2009/004355 filed Sep. 3, 2009 (with English Translation).
International Written Opinion mailed Dec. 15, 2009 in PCT/JP2009/004355 filed Sep. 3, 2009.
Xiaochun Zhu et al., "Bias-Field-Free Microwave Oscillator Driven by Perpendicularly Polarized Spin Current", IEEE Transactions on Magnetics, vol. 42, No. 10, Oct. 2006, pp. 2670-2672.

* cited by examiner

*Primary Examiner* — Angel Castro
(74) *Attorney, Agent, or Firm* — Oblon, Spivak, McClelland, Maier & Neustadt, L.L.P.

(57) ABSTRACT

A magnetic recorder includes: a magnetic recording medium; a reproducing head; a magnetic recording head including: a main magnetic pole; a first magnetic layer containing a TM alloy; a second magnetic layer containing a TM alloy or an RE-TM alloy; a third magnetic layer containing an RE-TM alloy; a first intermediate layer provided between the first magnetic layer and the second magnetic layer; and a second intermediate layer provided between the second magnetic layer and the third magnetic layer; and a signal processing portion which performs signal writing into the magnetic recording medium by using the magnetic recording head and reading from the magnetic recording medium by using the reproducing head.

11 Claims, 14 Drawing Sheets

SPIN OSCILLATOR OR MAGNETIC RECORDER INCLUDING MULTIPLE INJECTION LAYERS IN THE MAGNETIC RECORDING HEAD

CROSS-REFERENCE TO RELATED APPLICATION(S)

This is a Continuation Application of PCT Application No. PCT/JP2009/004355, filed on Sep. 3, 2009, which was published under PCT Article 21(2) in Japanese, the entire contents of which are incorporated herein by reference.

FIELD

The present invention relates to a magnetic recorder.

Background

A "high-frequency magnetic field assist recording method" has been proposed as a method for achieving high recording density. By the high-frequency magnetic field assist recording method, a high-frequency magnetic field with a frequency which is sufficiently higher than the recording signal frequency and is about the resonance frequency of a magnetic recording medium is applied locally. As a result, the magnetic recording medium resonates, and the coercive force (Hc) of the magnetic recording medium having the high-frequency magnetic field applied thereto is made equal to or less than a half of the initial coercive force. Therefore, by superposing the high-frequency magnetic field on the recording magnetic field, magnetic recording can be performed on a magnetic recording medium which has higher coercive force (Hc) and greater magnetic anisotropic energy (Ku). As a result, crystal grains of the medium can be made finer while deterioration of recording S/N due to heat fluctuations is suppressed, so that sufficient S/N can be obtained in spite of high recording density.

As a means for generating a high-frequency magnetic field, a method using a spin torque oscillator has been invented (e.g. see Patent Documents 1 to 5 and Non-Patent Document 1). According to the technique described in Patent Document 5, the spin torque oscillator includes a field generation layer, a spin injection layer, and an intermediate layer provided between the field generation layer and the spin injection layer. When a direct current flows into the spin torque oscillator through electrodes, the magnetization of the field generation layer ferromagnetically resonates by virtue of the spin torque generated from the spin injection layer. As a result, a high-frequency magnetic field is generated from the spin torque oscillator.

BRIEF DESCRIPTION OF DRAWINGS

A general architecture that implements the various features of the present invention will now be described with reference to the drawings. The drawings and the associated descriptions are provided to illustrate embodiments and not to limit the scope of the present invention.

DETAILED DESCRIPTION

Exemplary embodiments of the invention will be described below with reference to the drawings. Parts referred to by the same numerals in the undermentioned drawings designate the same parts so that duplicate description thereof will be omitted.

(First Exemplary Embodiment)

A spin torque oscillator 10 (hereinafter referred to as STO) according to a first exemplary embodiment of the invention will be described.

Figure 1:
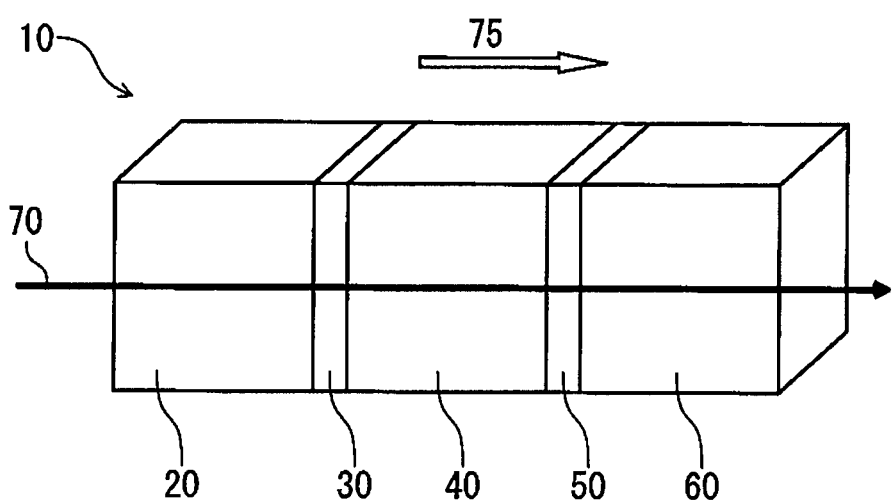
FIG. 1 is a view showing a spin torque oscillator according to a first exemplary embodiment of the invention.

FIG. 1 is a perspective view showing the STO 10 according to this exemplary embodiment.

The STO 10 according to this exemplary embodiment has a structure in which a spin injection layer 20 (first magnetic layer), an intermediate layer 30 (first intermediate layer), a field generation layer 40 (second magnetic layer), an intermediate layer 50 (second intermediate layer) and a spin injection layer 60 (third magnetic layer) are laminated in this order.

When a driving electron stream (a driving current flows in a direction opposite to the direction of the driving electron stream 70) flows in this laminating direction, that is, in a direction of an arrow 70 shown in FIG. 1, a high-frequency magnetic field can be generated from the STO 10. It is preferable that the driving current density on this occasion is set in a range of from $5 \times 10^7$ A/cm$^2$ to $1 \times 10^9$ A/cm$^2$, and is adjusted suitably to obtain a desired oscillation state. On this occasion, an external magnetic field (gap magnetic field) in a direction of an arrow 75 shown in FIG. 1 is applied on the STO 10 in the same laminating direction. The external magnetic field 75 can be applied by an excitation source such as a coil or the like. The principle of generation of the high-frequency magnetic field from the STO 10 will be described later.

Figure 2A:
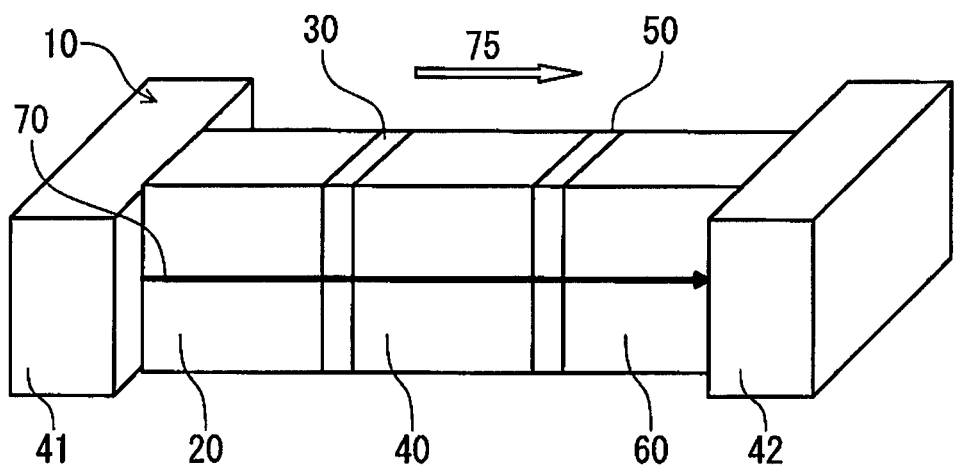
FIG. 2A is a view showing the spin torque oscillator according to the first exemplary embodiment.

As shown in FIG. 2A, when electrodes 41 and 42 are provided on the spin injection layers 20 and 60, a driving current can be made to flow into the STO 10. A low electric resistance and hardly oxidizable material such as Ti, Cu, etc. can be used as the material of each electrode.

A transition metal (hereinafter referred to as TM) alloy-including artificial lattice or a TM alloy which is so high in polarity that a positive GMR effect is generated between the spin injection layer 60 and the field generation layer 40 can be used for the spin injection layer 60. Incidentally, TM means one of Fe, Co and Ni or combination of these. TM alloy means an alloy containing TM. Specifically, FeCo, FeCoSi, NiFe, CoZrNb, FeN, FeSi, FeAlSi, FeCoAl, CoNiFe, CoFeB, CoIr or $Co_{99}Fe_1$ can be used as the TM alloy. Because these materials are high in polarity, large spin torque can be generated. For this reason, total spin torque 145 given to the field generation layer 40 due to conduction electrons in the spin injection layers 20 and 60 can be increased efficiently. Moreover, CoCr, CoCrPt, CoCrTa, CoCrTaPt, CoCrTaNb, TaFeCo, CoPt, FePt, CoPd, FePd or SmCo can be used as the TM alloy. Because the magnetization of these materials is oriented in a direction perpendicular to the film surface, perpendicular spin torque required for oscillation can be supplied so stably that the total spin torque 145 applied to the field generation layer 40 can be increased efficiently.

Fe/Co, Co/Pd, Co/Pt, Co/Ni or CoCrTa/Pd can be used as the TM alloy-including artificial lattice. Incidentally, "/" means an artificial lattice in which materials before and after "/" are laminated alternately five or more times. Because the artificial lattice formed in this manner permits magnetization to be oriented in a direction perpendicular to the film surface, perpendicular spin torque required for oscillation can be supplied so stably that the total spin torque 145 applied to the field generation layer 40 can be increased efficiently.

The spin injection layer 60 may be a laminate of a TM alloy-including artificial lattice and a TM alloy. Because the lamination permits optimization of the magnitude of spin torque and the orientation of perpendicular magnetization, the total spin torque 145 applied to the field generation layer 40 can be increased efficiently. It is preferable that the film thickness of the spin injection layer 60 is set in a range of from 15 nm to 25 nm.

A ferrimagnetic RE-TM alloy or laminated ferri-structure of TM and rare-earth metal (hereinafter referred to as RE) which is so relatively high in polarity that a negative GMR effect is generated between the spin injection layer 20 and the field generation layer 40 can be used for the spin injection layer 20. RE means one of Gd, Dy, Ho, Er, TM and Gd or combination of these.

The ferrimagnetic RE-TM alloy means an alloy of RE and TM. Specifically, it is preferable that the ferrimagnetic RE-TM alloy is any one of $GdFe_x$, $DyFe_y$, $HoFe_y$, $ErFe_y$, $TmFe_x$ and $GdCo_y$ (x is 2 or 3, and y is 2 to 4) (e.g. see Reference 1 "Handbook on magnetic substances, edited by Soshin Chikazumi, Keizo Ohta, Kengo Adachi, Noboru Tshuya and Yoshikazu Ishikawa, (May 6, 2006) Asakura Publishing Co. Ltd., pp. 290, pp. 420, pp. 512"), and that a material in which an upper limit temperature (Curie temperature) expressing ferrimagnetism is higher than the operating temperature (333K to 373K) of the STO 10 and magnetization of RE is larger than magnetization of TM is used.

The magnetization per atom of RE as a constituent member of the aforementioned RE-TM alloy is 7 $\mu_B$ for Gd, 10 $\mu_B$ for Dy, 10 $\mu_B$ for Ho, 9 $\mu_B$ for Er and 7 $\mu_B$ for Tm. The magnetization per atom of TM is 2.2 $\mu_B$ for Fe, 1.7 $\mu_B$ for Co and 0.6 $\mu_B$ for Ni. The value of x in each of the aforementioned chemical compounds can be estimated based on the magnetization of RE and TM constituting the aforementioned RE-TM alloy.

For example, in the case of $GdFe_x$, because the magnetization of Gd (RE) is about three times in magnitude as much as the magnetization of Fe (TM), the magnetization of RE becomes larger than the magnetization of TM when the configuration is up to three Fe atoms corresponding to one Gd atom.

According to the Reference 1, when x is 2, the Curie temperature of each of the aforementioned chemical compounds is 813K for $GdFe_2$, 663K for $DyFe_2$, 608K for $HoFe_2$, 473K for $ErFe_2$, 613K for $TmFe_2$ and 412K for $GdCo_2$.

It is generally known that the Curie temperature increases as the TM content of the RE-TM alloy becomes larger than the RE content thereof. Accordingly, the aforementioned chemical compounds can be used even when x is 3 and y is 3 or 4.

Incidentally, $GdFe_{x-z}Co_z$ (x is 2 or 3, and z is in a range of from 0 to x) may be used. The magnetization of TM in $GdFe_{x-z}Co_z$ takes an intermediate value between the magnetization of TM in $GdFe_x$ and the magnetization of TM in $GdCo_x$. Similarly, the Curie temperature of $GdFe_{x-z}Co_z$ also takes an intermediate value between the Curie temperature of $GdFe_x$ and the Curie temperature of $GdCo_x$. For this reason, by adjusting the composition ratio of Fe and Co, the magnetization of TM can be adjusted while the Curie temperature is kept. Thus, the total spin torque 145 given to the field generation layer 40 can be increased efficiently.

When the spin injection layer 20 is provided as a laminated ferri-structure, the TM alloy used for the spin injection layer 60 can be laminated through an intermediate layer to form a structure in which magnetizations of magnetic layer materials are substantially anti-parallel to each other. The laminated ferri-structure means a structure in which an intermediate layer is sandwiched between TM alloy-including layers. This serves the purpose of efficiently increasing the total spin torque 145 given to the field generation layer 40 by controlling the direction of magnetization of a magnetic layer which is part of the magnetic film of the spin injection layer 20 constituting the laminated ferri-structure and which is in contact with the intermediate layer 30. In this case, it is preferable that precious metal such as Cu, Pt, Au, Ag, Pd, Ru, etc. is used as the material of the intermediate layer, and it is also possible that nonmagnetic transition metal such as Cr, Rh, Mo, W, etc. is used. It is desirable that the film thickness of the intermediate layer is set in a range of from 0.3 nm to 1 nm so that magnetizations of magnetic layer materials are substantially anti-parallel to each other. It is preferable that the film thickness of the spin injection layer 20 is set in a range of from 10 nm to 25 nm.

A material which is so high polarity that a magnetic field is generated at the time of oscillation and which is high in saturation flux density and excellent in soft magnetic characteristic, such as a TM alloy-including artificial lattice or a TM alloy used for the spin injection layer 60 or a ferrimagnetic RE-TM alloy or a laminated ferri-structure used for the spin injection layer 20, can be used as the field generation layer 40. By using these materials, stable oscillation can be performed so that an intensive high-frequency magnetic field can be generated. Alternatively, a laminate of the aforementioned TM alloy-including artificial lattice and the TM alloy, the ferrimagnetic RE-TM alloy or the laminated ferri-structure may be used as the field generation layer 40. By laminating thus, the magnitude of spin torque and the density of saturation flux can be adjusted so that stable oscillation can be performed. It is preferable that the film thickness of the field generation layer 40 is set in a range of from 15 nm to 25 nm.

The intermediate layers 30 and 50 are made of a material (Cu) high in spin transmittance. It is preferable that the film thickness of each intermediate layer 30, 50 is in a range of from 2 nm to 3 nm. The intermediate layers 30 and 50 are used for transmitting spin polarization between each of the spin injection layers 20 and 60 and the field generation layer 40 and weakening magnetic coupling. A high spin transmittance material such as Cu, Au, Ag, etc. can be used as each of the intermediate layers 30 and 50.

The shape of the STO 10 may be not only a rectangular parallelepiped but also a circular or hexagonal column.

The principle of operation of the STO 10 according to this exemplary embodiment will be described next.

Figure 2B:
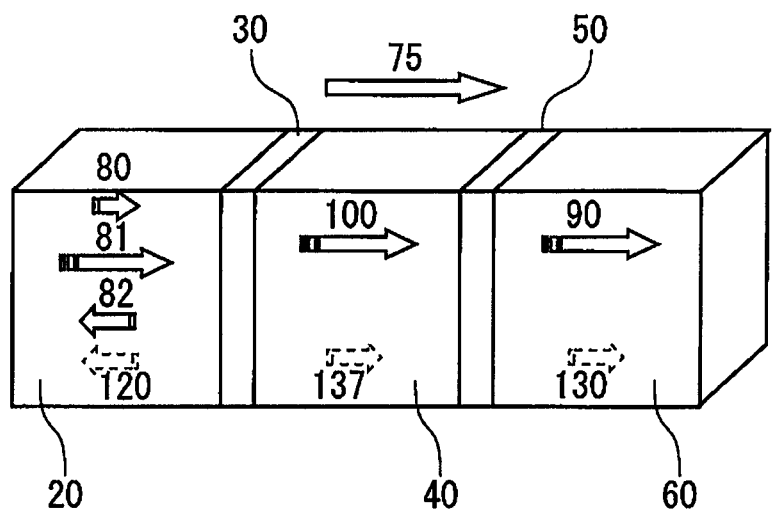
FIG. 2B is a view showing the spin torque oscillator according to the first exemplary embodiment.

FIG. 2B is a conceptual view for explaining spin polarization of conduction electrons of the STO 10 according to this exemplary embodiment and a GMR effect. FIG. 2B shows the case where an external magnetic field 75 is applied from the spin injection layer 20 toward the spin injection layer 60 but no driving electron stream 70 is passed.

By applying the external magnetic field 75 to the STO 10, magnetization 80 of the spin injection layer 20, magnetization 90 of the spin injection layer 60 and magnetization 100 of the field generation layer 40 are made parallel to the external magnetic field 75. This is because coercive forces of the spin injection layer 20, the spin injection layer 60 and the field generation layer 40 are smaller than the magnitude of the external magnetic field 75. Moreover, because magnetization of RE of the spin injection layer 20 provided as a ferrimagnetic substance is larger than magnetization of TM, magnetization 81 of RE of the spin injection layer 20 becomes parallel to the external magnetic field 75 but magnetization 82 of TM of the spin injection layer 20 becomes antiparallel to the external magnetic field 75.

By s-d orbit interaction in the spin injection layer 60, magnetization 90 of the spin injection layer 60 is made parallel to spin polarization 130 of conduction electrons in the spin injection layer 60. Similarly, magnetization 100 of the field generation layer 40 and spin polarization 137 of conduction electrons in the field generation layer 40 become parallel to the external magnetic field 75.

For this reason, when the magnetization 90 of the spin injection layer 60 and the magnetization 100 of the field generation layer 40 are parallel to each other, the spin polarization 130 of conduction electrons in the spin injection layer 60 and the spin polarization 137 of conduction electrons in the field generation layer 40 become parallel to each other to obtain a low resistance state where spin-polarized conduction electrons can pass easily. On the other hand, when magnetizations are antiparallel to each other (not shown), spin polarizations become antiparallel to each other to obtain a high resistance state where spin-polarized conduction electrons can hardly pass. That is, this shows that a positive GMR effect is generated between the spin injection layer 60 and the field generation layer 40.

Moreover, spin polarization 120 of conduction electrons in the spin injection layer 20 is made parallel to magnetization 82 of TM of the spin injection layer 20 by s-d orbit interaction with TM of the spin injection layer 20. This is antiparallel to the magnetization 80 of the spin injection layer 20. For this reason, when the magnetization 80 of the spin injection layer 20 and the magnetization 100 of the field generation layer 40 are parallel to each other, the spin polarization 120 of conduction electrodes in the spin injection layer 20 and the spin polarization 137 of conduction electrons in the field generation layer 40 become antiparallel to each other to obtain a high resistance state where spin-polarized conduction electrons can hardly pass. On the other hand, when magnetizations are antiparallel to each other (not shown), spin polarizations become parallel to each other to obtain a low resistance state where spin-polarized conduction electrons can pass easily.

That is, this shows that a negative GMR effect is generated between the spin injection layer 20 and the field generation layer 40.

Figure 2C:
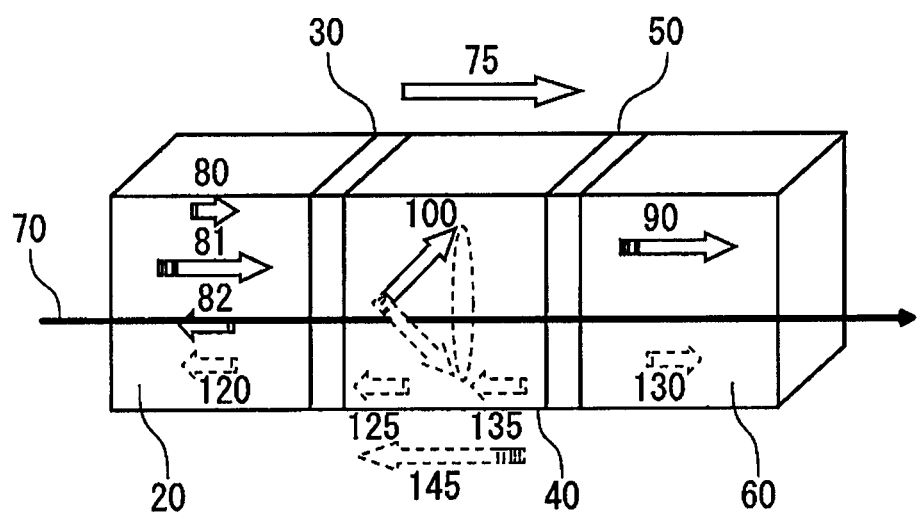
FIG. 2C is a view showing the spin torque oscillator according to the first exemplary embodiment.

FIG. 2C is a conceptual view for explaining the operation of the STO 10 according to this exemplary embodiment. FIG. 2C shows the case where an external magnetic field 75 is applied from the spin injection layer 20 toward the spin injection layer 60 and a driving electron stream 70 is further passed. By applying the external magnetic field 75 to the STO 10, magnetization of the spin injection layer 20 (magnetization 80) and magnetization of the spin injection layer 60 (magnetization 90) turn in the same direction as the external magnetic field 75. This is because coercive forces of the spin injection layers 20 and 60 are smaller than the magnitude of the external magnetic field 75.

Spin-polarized conduction electrons in the spin injection layer 20 pass through and flow into the field generation layer 40, so that angular momentum of spin polarization of conduction electrons is transferred to magnetization of the field generation layer 40. This is spin torque 125 given to the field generation layer 40 due to conduction electrons in the spin injection layer 20. The spin torque 125 given to the field generation layer 40 due to conduction electrons in the spin injection layer 20, which is spin torque due to conduction electrons transmitted to the field generation layer 40, becomes parallel to the spin polarization 120 of conduction electrons in the spin injection layer 20 but antiparallel to the external magnetic field 75.

On the other hand, when conduction electrons in the field generation layer 90 flow into the spin injection layer 60, conduction electrons spin-polarized in parallel to conduction electrons in the spin injection layer 40 flow in. However, conduction electrons spin-polarized in antiparallel are reflected so that angular momentum of spin polarization is transferred to magnetization of the field generation layer 40. This is spin torque 135 given to the field generation layer 40 due to conduction electrons in the spin injection layer 60. The spin torque 135 given to the field generation layer 40 due to conduction electrons in the spin injection layer 60, which is spin torque due to conduction electrons reflected toward the field generation layer 40, becomes antiparallel to the spin polarization 130 of conduction electrons in the spin injection layer 60 and antiparallel to the external magnetic field 75.

The two spin torques given to the field generation layer 40 (the spin torque 125 due to conduction electrons in the spin injection layer 20 and the spin torque 135 due to conduction electrons in the spin injection layer 60) are parallel to each other and intensify each other. This total spin torque 145 given to the field generation layer 40 balances with the external magnetic field 75. Moreover, because coercive force of the field generation layer 40 is smaller than the magnitude of the external magnetic field 75 so that magnetization 100 of the field generation layer 40 can move freely, the magnetization 100 of the field generation layer 40 oscillates to generate a high-frequency magnetic field.

By using the two kinds of spin injection layers (the spin injection layer 20 and the spin injection layer 60) exerting positive and negative GMR effects as described above, the effect of this exemplary embodiment can be obtained because the spin polarization 120 of conduction electrons in the spin injection layer 20 and the spin polarization 130 of conduction electrons in the spin injection layer 60 become antiparallel to each other and the spin torque 125 due to conduction electrons in the spin injection layer 20 and the spin torque 135 due to conduction electrons in the spin injection layer 60 become parallel to each other and intensify each other. Because the effect of this exemplary embodiment can be obtained as long as the aforementioned configuration is taken, the driving electron stream 70 and the external magnetic field 75 need not be substantially parallel or antiparallel to each other but may make an arbitrary angle. Moreover, because the field generation layer 40 oscillates based on balance between the external magnetic field 75 and the total spin torque 145 given to the field generation layer 40, it is desirable that the direction of the driving electron stream 70 is a flow direction from the ferrimagnetic spin injection layer (spin injection layer 20) to the other spin injection layer (spin injection layer 60).

Figure 2D:
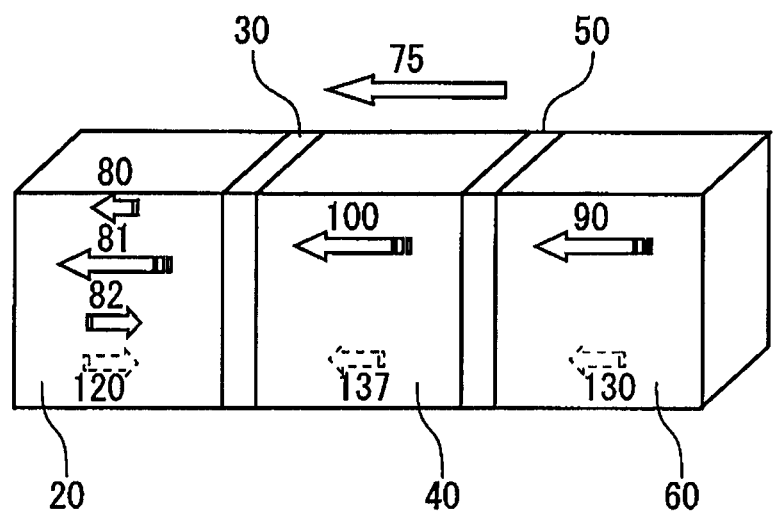
FIG. 2D is a view showing the spin torque oscillator according to the first exemplary embodiment.
Figure 2D:
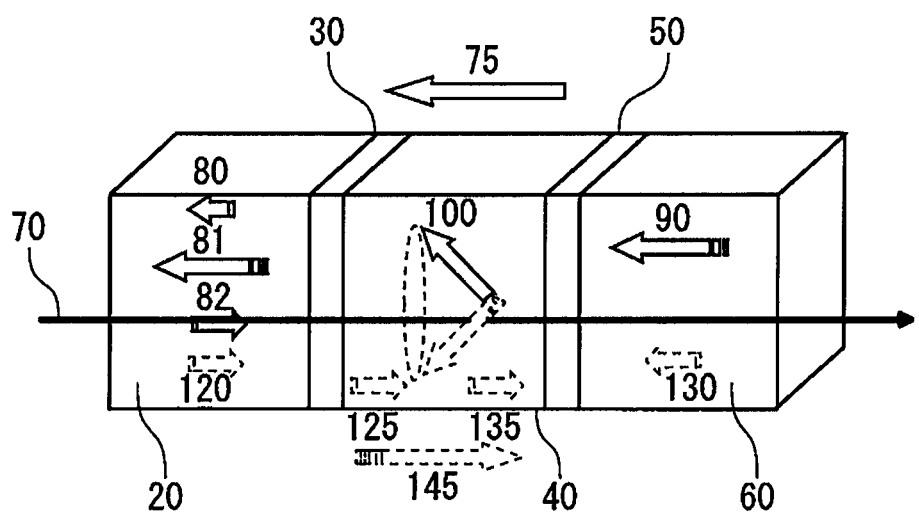

FIG. 2D is a conceptual view for explaining the operation of the STO 10 according to this exemplary embodiment. FIG. 2D shows the case where an external magnetic field 75 is applied from the spin injection layer 60 toward the spin injection layer 20.

Incidentally, an upper half of FIG. 2D shows a view when the external magnetic field 75 is applied, and a lower half of FIG. 2D shows a view when the external magnetic field 75 is applied and a driving electron stream 70 is passed.

The coercive force of the spin injection layer 20, the coercive force of the spin injection layer 60 and the coercive force of the field generation layer 40 are smaller than the magnitude of the external magnetic field 75. Thus, even when the direction of the external magnetic field 75 is inverted, the magnetization 80 of the spin injection layer 20, the magnetization 90 of the spin injection layer 60 and the magnetization 100 of the field generation layer 40 can be kept substantially parallel to the direction of the external magnetic field 75. Although detailed description of the direction of spin torque to the field generation layer 40 in the case where the driving electron stream 70 is passed will be omitted because this is the same as in the case where the direction of the external magnetic field 75 is from the injection layer 20 to the injection layer 60, the field generation layer 90 oscillates stably because the total spin torque 145 given to the field generation layer 40 and the external magnetic field 75 balance with each other finally. In this manner, the field generation layer 40 can oscillate stably regardless of the direction of the external magnetic field 75, so that a stable high-frequency magnetic field is generated. As a result, both upward magnetization and downward magnetization can be recorded stably on the recording medium.

Because the STO 10 according to this exemplary embodiment uses two spin injection layers having a negative GMR and a positive GMR so that the directions of spin torques from the two spin injection layers (spin torque 125 due to conduction electrons in the spin injection layer 20 and spin torque 135 due to conduction electrons in the spin injection layer 60) can be made substantially parallel to each other and intensify each other, a high-frequency magnetic field can be oscillated by a small driving electron stream 70. Moreover, by increasing the film thickness of the field generation layer 40, a high-frequency magnetic field with sufficient intensity can be generated.

Incidentally, a STO using an RE-TM layer as a spin injection layer has been known (e.g. see U.S. Pat. No. 7,239,265 Specification). However, spin torque is insufficient by means of only the RE-TM layer so that it is impossible to oscillate the field generation layer capable of generating an intensive high-frequency magnetic field.

(Modification 1)

Figure 2E:
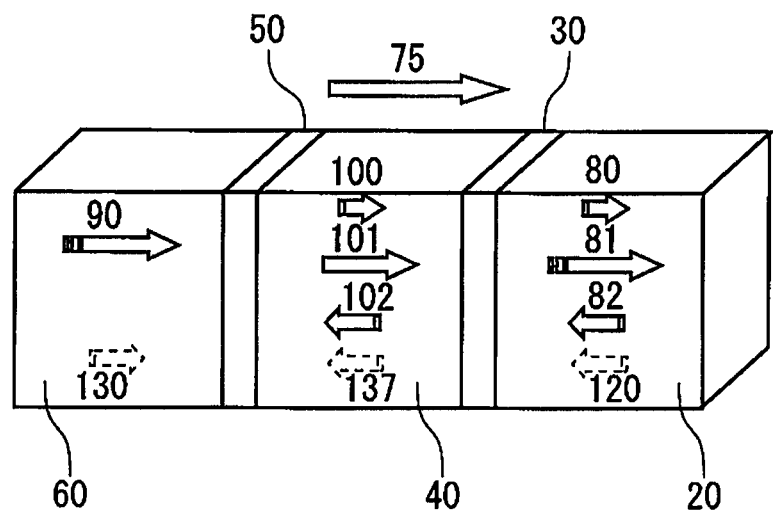
FIG. 2E is a view showing a modification of the first exemplary embodiment.
Figure 2E:
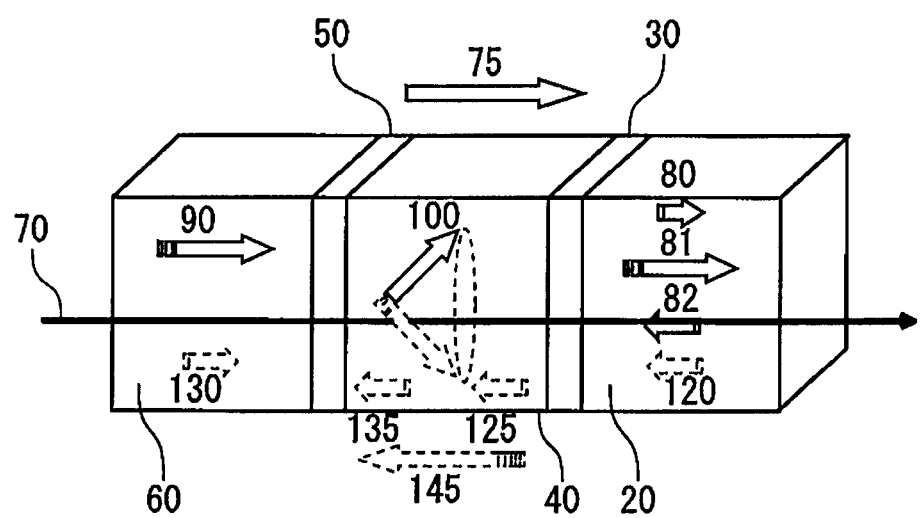

FIG. 2E is a view showing a modification of the first exemplary embodiment.

Incidentally, an upper half of FIG. 2E shows a view when an external magnetic field 75 is applied, and a lower half of FIG. 2E shows a view when an external magnetic field 75 is applied and a driving electron stream 70 is passed.

The STO 10 according to this modification has a structure in which a spin injection layer 60 (third magnetic layer), an intermediate layer 50 (second intermediate layer), a field generation layer 40 (second magnetic layer), an intermediate layer 30 (first intermediate layer) and a spin injection layer 20 (first magnetic layer) are laminated in this order.

In this modification, the external magnetic field 75 is applied from the spin injection layer 60 toward the spin injection layer 20. The driving electron stream 70 is passed from the ferrimagnetic spin injection layer 20 toward the spin injection layer 60.

When configuration is made so that a negative GMR is generated between the spin injection layer 60 and the field generation layer 40 and a positive GMR is generated between the field generation layer 40 and the spin injection layer 20, the effect of the first exemplary embodiment can be obtained.

On this occasion, the spin injection layer 60 is made of a material (CoPt film) which orients magnetization in a direction perpendicular to a film surface.

The field generation layer 40 and the spin injection layer 20 are made of a ferrimagnetic RE-TM alloy film ($GdFe_3$ film). The same material as that of the spin injection layer 20 can be used for the field generation layer 40. It is desirable that the spin injection layer 20 is formed as a laminate of a ferrimagnetic film and a perpendicularly magnetization oriented film or the spin injection layer 20 has magnetic volume (the product of saturation flux density (Bs) and volume) sufficiently larger than the field generation layer 40 in order to fix magnetization of the spin injection layer 20.

The principle of operation of this modification will be described next.

An upper half of FIG. 2E is a conceptual view for explaining spin polarization of conduction electrons of the STO 10 according to this exemplary embodiment and a GMR effect. This shows the case where an external magnetic field 75 is applied from the spin injection layer 60 toward the spin injection layer 20 but no driving electron stream 70 is passed.

By applying the external magnetic field 75 to the STO 10, magnetization 90 of the spin injection layer 60, magnetization 100 of the field generation layer 40 and magnetization 80 of the spin injection layer 20 are made parallel to the external magnetic field 75. This is because coercive forces of the spin injection layer 20, the field generation layer 40 and the spin injection layer 60 are smaller than the magnitude of the external magnetic field 75. Moreover, because magnetization 101 of RE of the field generation layer 40 and magnetization 81 of RE of the spin injection layer 20 provided as ferrimagnetic substances are larger than magnetizations 102 and 82 of TM respectively, the magnetization 101 of RE of the field generation layer 40 and the magnetization 81 of RE of the spin injection layer 20 become parallel to the external magnetic field 75 but the magnetization 102 of TM of the field generation layer 40 and the magnetization 82 of TM of the spin injection layer 20 become antiparallel to the external magnetic field 75.

By s-d orbit interaction in the spin injection layer 60, magnetization 90 of the spin injection layer 60 is made parallel to spin polarization 130 of conduction electrons in the spin injection layer 60.

On the other hand, spin polarization 137 of conduction electrons in the field generation layer 40 is made parallel to magnetization 102 of TM of the field generation layer 40 by s-d orbit interaction with TM of the field generation layer 40. This is antiparallel to the magnetization 100 of the field generation layer 40. For this reason, when the magnetization 90 of the spin injection layer 60 and the magnetization 100 of the field generation layer 40 are parallel to each other, the spin polarization 130 of conduction electrons in the spin injection layer 60 and the spin polarization 137 of conduction electrons in the field generation layer 40 become antiparallel to each other to obtain a high resistance state where spin-polarized conduction electrons can hardly pass. On the other hand, when magnetizations are antiparallel to each other (not shown), spin polarizations become parallel to each other to obtain a low resistance state where spin-polarized conduction electrons can pass easily. That is, this shows that a negative GMR effect is generated between the spin injection layer 60 and the field generation layer 40.

Similarly, spin polarization 120 of conduction electrons in the spin injection layer 20 is also made parallel to magnetization 82 of TM of the spin injection layer 20 by s-d orbit interaction with TM of the spin injection layer 20 like the spin polarization 137 of conduction electrons in the field generation layer 40. This is antiparallel to the magnetization 80 of the spin injection layer 20. The spin polarization 120 of conduction electrons in the spin injection layer 20 becomes antiparallel to the external magnetic field 75.

For this reason, when the magnetization 100 of the field generation layer 40 and the magnetization 80 of the spin injection layer 20 are parallel to each other, the spin polarization 120 of conduction electrons in the spin injection layer 20 and the spin polarization 137 of conduction electrons in the field generation layer 40 become parallel to each other to obtain a low resistance state where spin-polarized conduction electrons can pass easily. On the other hand, when magnetizations are antiparallel to each other (not shown), spin polarizations also become antiparallel to each other to obtain a high resistance state where spin-polarized conduction electrons can hardly pass. That is, this shows that a positive GMR effect is generated between the field generation layer 40 and the spin injection layer 20.

A lower half of FIG. 2E is a conceptual view for explaining the operation of the STO 10 according to this modification. This shows the case where an external magnetic field 75 is applied from the spin injection layer 60 toward the spin injection layer 20 and a driving electron stream 70 is further passed from the spin injection layer 20 toward the spin injection layer 60.

By applying the external magnetic field 75 to the STO 10, magnetization of the spin injection layer 60 (magnetization 90) and magnetization of the spin injection layer 20 (magnetization 80) turn in the same direction as the external magnetic field 75. This is because coercive forces of the spin injection layers 20 and 60 are smaller than the magnitude of the external magnetic field 75.

Spin-polarized conduction electrons in the spin injection layer 20 pass through and flow into the field generation layer 40, so that angular momentum of spin polarization of conduction electrons is transferred to magnetization of the field generation layer 40. This is spin torque 125 given to the field generation layer 90 due to conduction electrons in the spin injection layer 20. The spin torque 125 given to the field generation layer 90 due to conduction electrons in the spin injection layer 20, which is spin torque due to conduction electrons transmitted to the field generation layer 40, becomes parallel to the spin polarization 120 of conduction electrons in the spin injection layer 20 but antiparallel to the external magnetic field 75.

On the other hand, when conduction electrons in the field generation layer 40 flow into the spin injection layer 60, conduction electrons spin-polarized in parallel to conduction electrons in the spin injection layer 60 flow in. However, conduction electrons spin-polarized in antiparallel are reflected so that angular momentum of spin polarization is transferred to magnetization of the field generation layer 40. This is spin torque 135 given to the field generation layer 40 due to conduction electrons in the spin injection layer 60. The spin torque 135 given to the field generation layer 40 due to conduction electrons in the spin injection layer 60, which is spin torque due to conduction electrons reflected toward the field generation layer 40, becomes antiparallel to the spin polarization 130 of conduction electrons in the spin injection layer 60 and antiparallel to the external magnetic field 75.

The two spin torques given to the field generation layer 40 (the spin torque 125 due to conduction electrons in the spin injection layer 20 and the spin torque 135 due to conduction electrons in the spin injection layer 60) are parallel to each other and intensify each other. This total spin torque 145 given to the field generation layer 40 balances with the external magnetic field 75. Moreover, because coercive force of the field generation layer 40 is smaller than the magnitude of the external magnetic field 75 so that magnetization 100 of the field generation layer 40 can move freely, the magnetization 100 of the field generation layer 40 oscillates to generate a high-frequency magnetic field.

According to this modification, a high-frequency magnetic field can be generated by a small quantity of a driving electron stream 70 (a small quantity of driving current).

(Second Exemplary Embodiment)

A magnetic recording head according to a second exemplary embodiment of the invention will be described.

Figure 3:
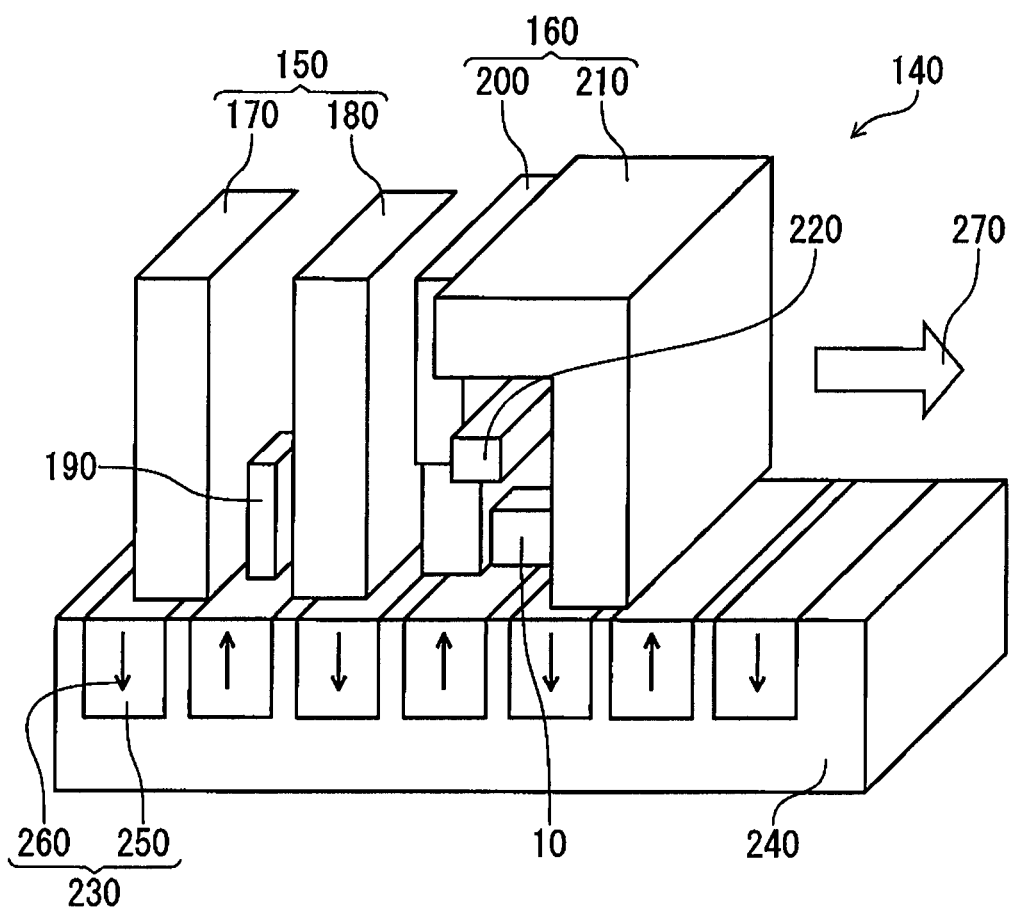
FIG. 3 is a view showing a magnetic recording head according to a second exemplary embodiment of the invention.

FIG. 3 is a view showing a magnetic recording head 140 according to this exemplary embodiment.

The magnetic recording head 140 according to this exemplary embodiment has a reproducing head portion 150, and a write head portion 160. The reproducing head portion 150 has a magnetic shielding layer 170, a magnetic shielding layer 180, and a magnetic reproducing element 190. The magnetic reproducing element 190 is provided between the magnetic shielding layer 170 and the magnetic shielding layer 180.

The write head portion 160 has a main magnetic pole 200, a shield 210 (return path), an exciting coil 220, and an STO 10. Respective constituent members of the reproducing head portion 150 and respective constituent members of the write head portion 160 are separated by an insulator (not shown) such ass alumina, etc.

A GMR element, a TMR (Tunnel Magneto Resistive) element or the like can be used as the magnetic reproducing element 190. The magnetic reproducing element 190 is provided between the magnetic shielding layer 170 and the magnetic shielding layer 180 in order to improve reproductive resolving power.

A magnetic recording medium 230 has a medium substrate 240, and a magnetic recording layer 250 provided thereon. The recording magnetization 260 of the magnetic recording layer 250 is controlled in a predetermined direction by a magnetic field applied from the write head portion 160, so that writing is performed. The reproducing head portion 150 reads the direction of the recording magnetization 260 of the magnetic recording layer 250.

Electrodes 41 and 42 are embedded in the main magnetic pole 200 and the shield 210. The electrodes 41 and 42 may be embedded in the main magnetic pole 200 and the shield 210 as shown in this exemplary embodiment or may be disposed between the main magnetic pole 200 and the STO 10 and between the shield 210 and the STO 10 respectively. In addition, the electrodes 41 and 42 may be connected externally so that the STO 10 is put between the electrodes 41 and 42, as described in the first exemplary embodiment.

The main magnetic pole 200 and the shield 210 are made of a relatively high saturation flux density soft magnetic layer such as FeCo, CoFe, CoNiFe, NiFe, CoZrNb, FeN, FeSi, FeAlSi, etc.

A low electric resistance and hardly oxidizable material such as Ti, Cu, etc. can be used as the exciting coil 220.

Figure 4:
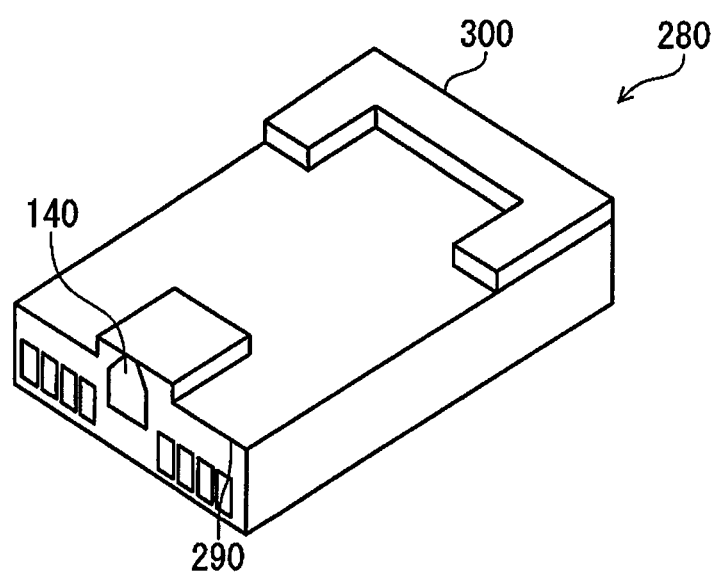
FIG. 4 is a view showing a head slider according to the second exemplary embodiment.

FIG. 4 is a perspective view of a head slider 280 in which the magnetic recording head 140 according to this exemplary embodiment is provided.

As shown in FIG. 4, the magnetic recording head 140 described in this exemplary embodiment is provided in the head slider 280. The head slider 280 is made of $Al_2O_3$/TiC or the like and designed so that the head slider 280 can move relatively while floating on or coming into contact with the magnetic recording medium 230 such as a magnetic disk, etc, and the head slider 280 has an air inflow side 290 and an air outflow side 300.

Figure 5:
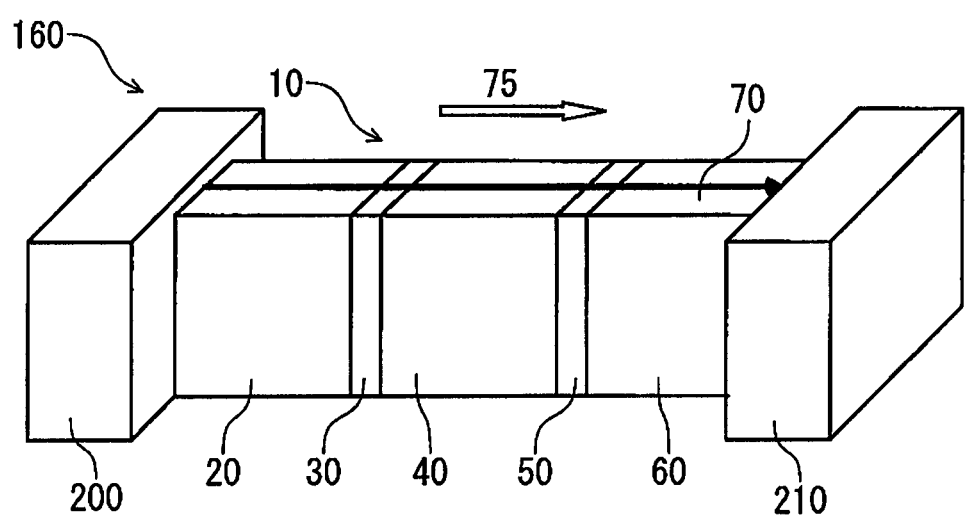
FIG. 5 is a view for explaining the magnetic recording head according to the second exemplary embodiment.

FIG. 5 is a perspective view of the magnetic recording head 140 according to this exemplary embodiment.

FIG. 5 shows a state where the STO 10 is put between the main magnetic pole 200 and the shield 210.

In the STO 10 laminated from the spin injection layer 20 toward the spin injection layer 60, the main magnetic pole 200 and the shield 210 are provided opposite to each other in the direction of lamination. That is, the direction of lamination of the STO 10 and the medium moving direction 270 are parallel to each other.

By providing the main magnetic pole 200 and the shield 210, the external magnetic field (gap magnetic field) 75 can be applied on the STO 10 in a direction from the main magnetic pole 200 to the shield 210.

The configuration and principle of operation of the STO 10 are the same as described in the first exemplary embodiment and description thereof will be omitted.

Figure 6A:
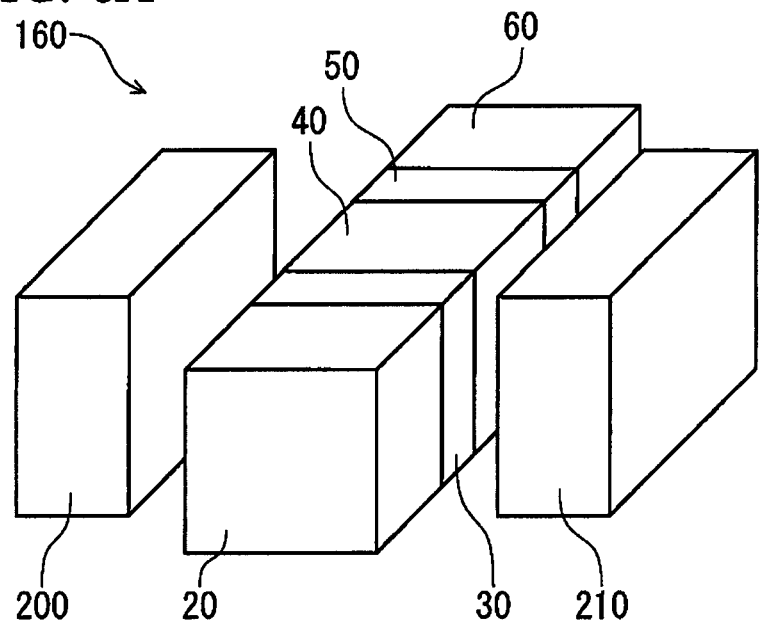
FIG. 6A is a view for explaining the magnetic recording head according to the second exemplary embodiment.

FIG. 6A shows a modification of the magnetic recording head 140 according to this exemplary embodiment.

FIG. 6A shows a state where the STO 10 is put between the main magnetic pole 200 and the shield 210. In FIG. 6A, the main magnetic pole 200 and the shield 210 are provided opposite to each other in a direction perpendicular to the direction of lamination in the STO 10 laminated from the spin injection layer 20 toward the spin injection layer 60. Alternatively, the direction of lamination may be a direction from the spin injection layer 60 toward the spin injection layer 20. On this occasion, the direction of lamination of the STO 10 and the medium moving direction 270 are perpendicular to each other. The principle of operation of the STO 10 is the same as described in the first exemplary embodiment and description thereof will be therefore omitted.

By setting the direction of lamination of the STO 10 to be perpendicular to the medium moving direction 270 in this manner, the distance between the shield 210 and the main magnetic pole 200 can be shortened so that linear recording density at writing can be improved.

Figure 6B:
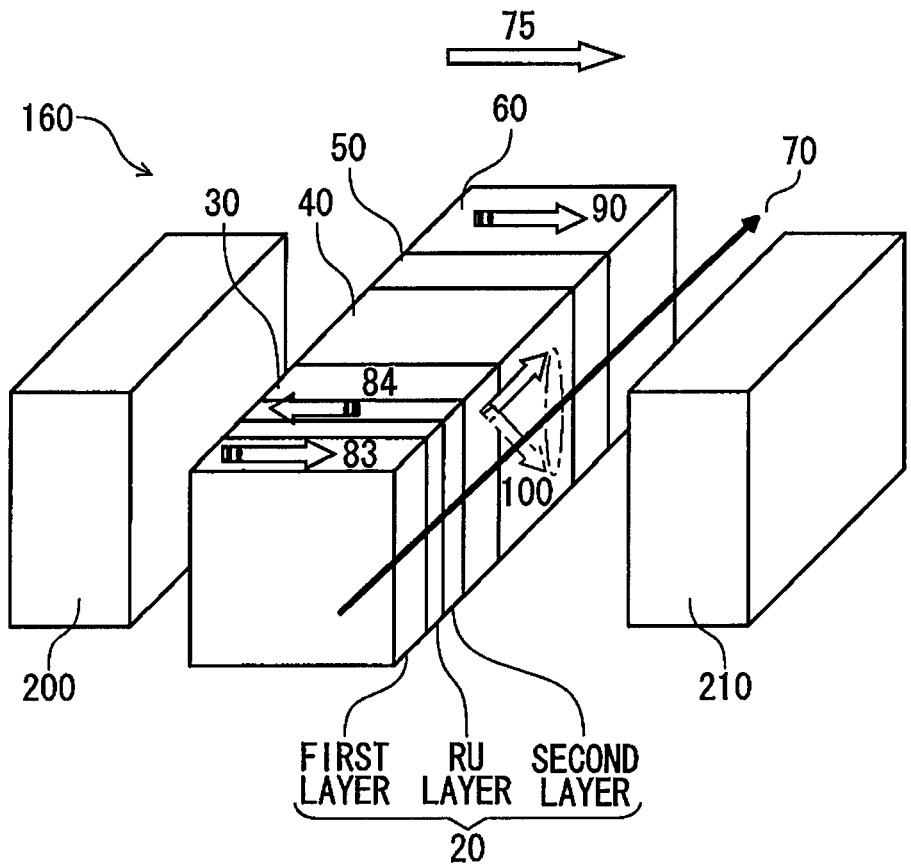
FIG. 6B is a view for explaining the magnetic recording head according to the second exemplary embodiment.

For example, as shown in FIG. 6B, the spin injection layer 20 can be provided as a laminated ferri-structure having an Ru layer provided between a first layer 83 and a second layer 84. The first layer 83 has a magnetic film thickness (the product of saturation flux density (Bs) and film thickness) larger than that of the second layer 84. It is desirable that the first layer 83 is 10 to 20 nm thick and the second layer 84 is 5 to 15 nm thick. It is desirable that the film thickness of the Ru layer is adjusted in a range of from 0.5 to 1 nm to thereby antiferromagnetically couple the first layer 83 and the second layer 84 with each other. A material such as CoIr or FeCo used as the field generation layer 40 can be used as each of the first layer 83 and the second layer 84. It is preferable that precious metal such as Cu, Pt, Au, Ag, Pd, Ru, etc. is used as the material of the Ru layer or nonmagnetic transition metal such as Cr, Rh, Mo, W, etc. may be used. By using these materials, the spin injection layer 20 is formed as a laminated ferri-structure in which the first layer 83 and the second layer 84 are magnetized in antiparallel to each other.

By the configuration as shown in FIGS. 5, 6A and 6B, a high-frequency magnetic field can be generated by a small quantity of a driving electron stream 70 (a small quantity of driving current). Moreover, by high-frequency magnetic field oscillation of the STO 10 according to this exemplary embodiment, a magnetic recording head having a high recording capacity can be provided.

(Modification 2)

Figure 6C:
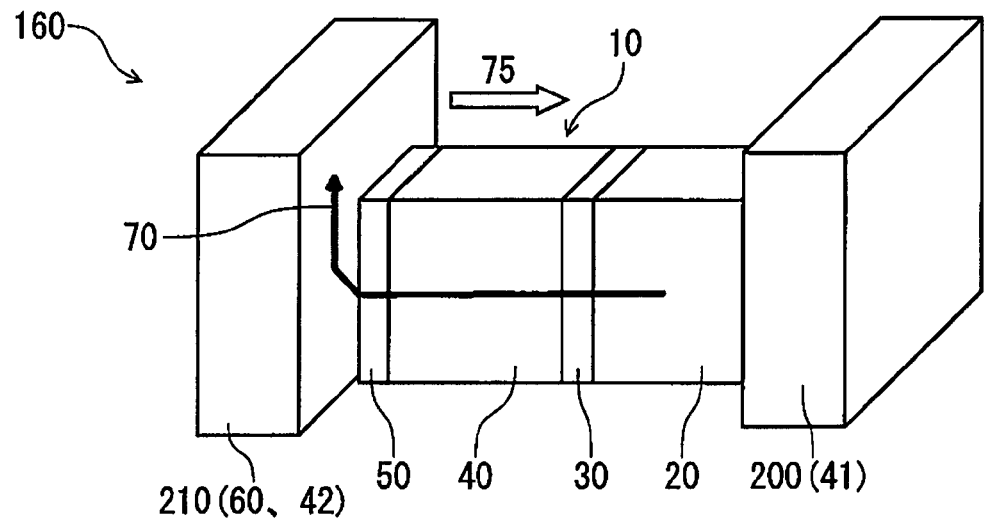
FIG. 6C is a view showing a modification of the second exemplary embodiment.

FIG. 6C is a view showing a modification of the second exemplary embodiment.

A magnetic recording head 140 according to this modification has a shield 210 and a main magnetic pole 200 which are provided opposite to each other with respect to a direction of lamination in such a laminate that an intermediate layer 50, a field generation layer 40, an intermediate layer 30 and a spin injection layer 20 are laminated in this order. That is, the direction of lamination of the STO 10 and the medium moving direction 270 become parallel to each other.

On this occasion, the shield 210 serves as an electrode 42 and also as a spin injection layer 60. This is because the shield 210 is made of a soft magnetic material.

The direction of passage of the driving electron stream 70 is a direction from the spin injection layer 20 provided as a ferrimagnetic layer toward the shield 210. By the configuration of this modification, a high-frequency magnetic field can be generated by a small quantity of a driving electron stream 70 (a small quantity of driving current).

Because the shield 210 serves as a spin injection layer 60, the distance between the shield 210 and the main magnetic pole 200 can be shortened so that linear recording density at writing can be improved.

(Modification 3)

Figure 6D:
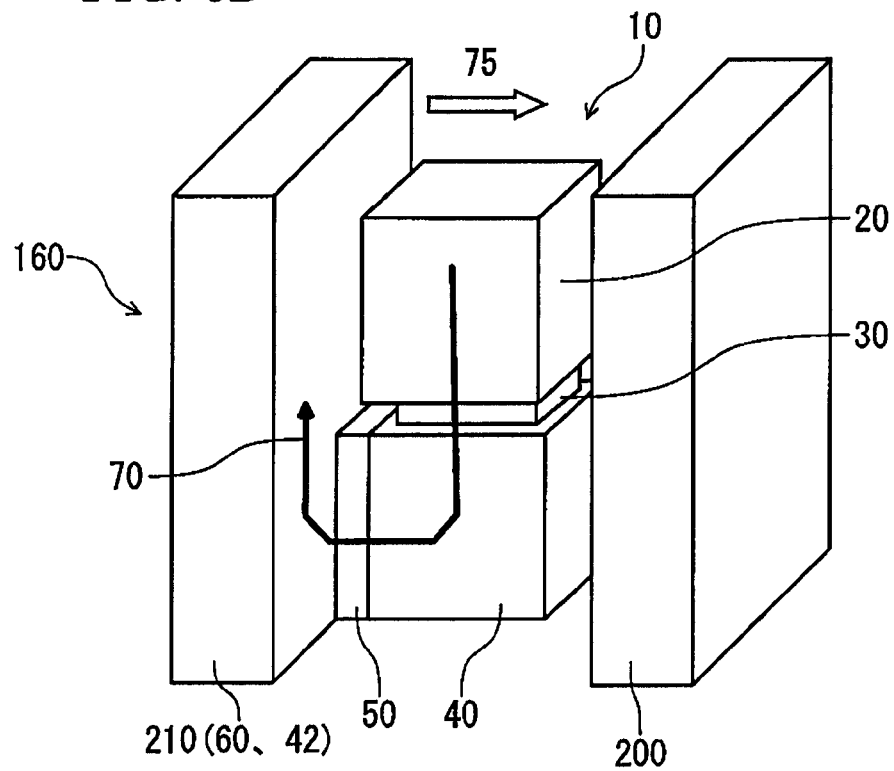
FIG. 6D is a view showing a modification of the second exemplary embodiment.

FIG. 6D is a view showing a modification of the second exemplary embodiment.

A magnetic recording head 140 according to this modification has a shield 210 and a main magnetic pole 200 which are provided opposite to each other with respect to a direction perpendicular to a direction of lamination in such a laminate that a field generation layer 40, an intermediate layer 30 and a spin injection layer 20 are laminated in this order. That is, the direction of lamination of the STO 10 and the medium moving direction 270 become perpendicular to each other. An intermediate layer 50 is further provided between the field generation layer 40 and the shield 210.

On this occasion, the shield 210 serves as an electrode 42 and also as a spin injection layer 60. This is because the shield 210 is made of a soft magnetic material.

The driving electron stream 70 passes through the intermediate layer 30, the field generation layer 40, the intermediate layer 50 and the shield 210 successively from the spin injection layer 20 provided as a ferrimagnetic layer.

Because the shield 210 serves as a spin injection layer 60, not only a high-frequency magnetic field can be generated by a small quantity of a driving electron stream 70 (a small quantity of driving current) but also the distance between the shield 210 and the main magnetic pole 200 can be shortened so that linear recording density at writing can be improved.

(Third Exemplary Embodiment)

A magnetic recorder, a magnetic head assembly and a magnetic recording medium according to a third exemplary embodiment of the invention will be described.

Figure 7:
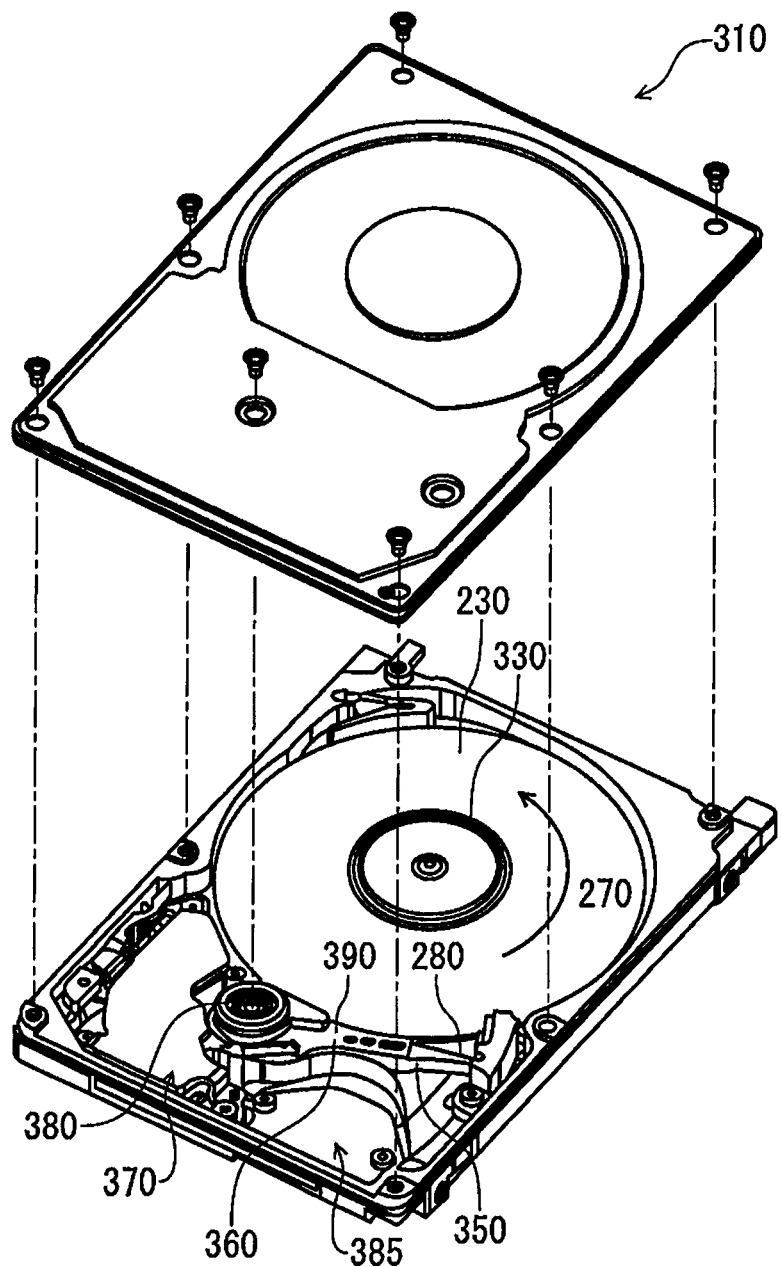
FIG. 7 is a view showing a magnetic recorder according to a third exemplary embodiment of the invention.

FIG. 7 is a perspective view showing a magnetic recorder according to this exemplary embodiment.

As shown in FIG. 7, the magnetic recorder 310 according to this exemplary embodiment is an apparatus of the type using a rotary actuator. A magnetic recording medium 230 is provided on a spindle motor 330 and rotated in a direction of the medium moving direction 270 by a motor (not shown) which responds to a control signal given from a driving control portion (not shown). The magnetic recorder 310 may has a plurality of magnetic recording media 230.

A head slider 280 which performs recording/reproduction of information stored in the magnetic recording medium 230 has a configuration described in the second exemplary embodiment. The head slider 280 is attached to a front end of a thin film-like suspension 350. The head slider 280 is disposed so that the magnetic recording head 140 described in the second exemplary embodiment is provided near a front end of the head slider 280.

When the magnetic recording medium 230 rotates, the pressure made by the suspension 350 balances with the pressure generated in an air-bearing surface (ABS) of the head slider 280. The air-bearing surface of the head slider 280 is held with a predetermined floating quantity from a surface of the magnetic recording medium 230. A "contact traveling type" in which the head slider 280 comes into contact with the magnetic recording medium 230 may be used.

The suspension 350 is connected to one end of an actuator arm 360 having a bobbin portion etc. holding a driving coil (not shown). A voice coil motor 370 which is a kind of linear motor is provided at the other end of the actuator arm 360. The voice coil motor 370 can be constituted by a driving coil (not shown) wound on the bobbin portion of the actuator arm 360, and a magnetic circuit including a permanent magnet and a counter yoke which are provided opposite to each other so that the driving coil is put between the permanent magnet and the counter yoke.

The actuator arm 360 is held by ball bearings (not shown) provided in two, upper and lower places of a bearing portion 380 so that the actuator arm 360 can be slidably rotated by the voice coil motor 370. As a result, the magnetic recording head 140 can be moved to an arbitrary position of the magnetic recording medium 230.

Figure 8A:
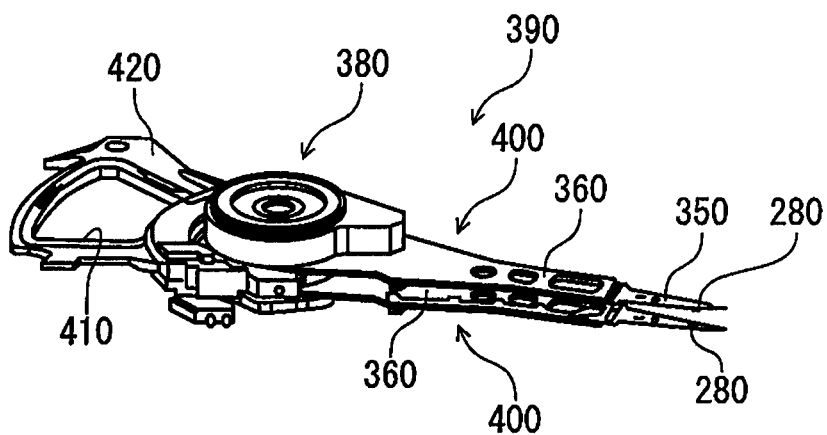
FIG. 8A is a view for explaining the a magnetic recorder according to the third exemplary embodiment.

FIG. 8A shows a head stack assembly 390 as a constituent part of the magnetic recorder according to this exemplary embodiment.

Figure 8B:
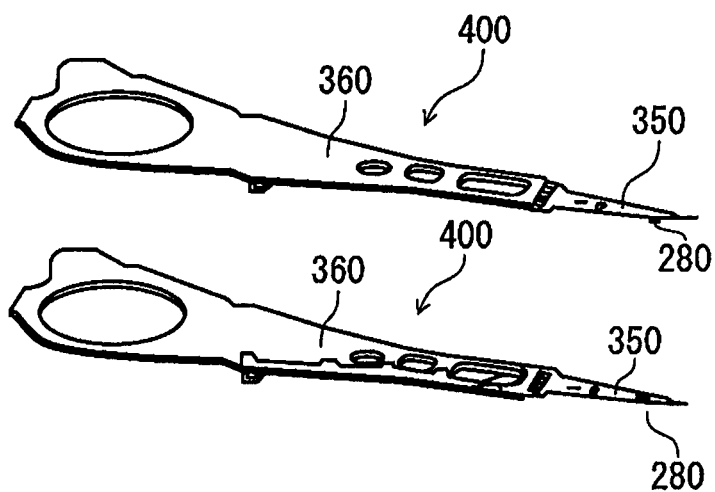
FIG. 8B is a view for explaining the a magnetic recorder according to the third exemplary embodiment.

FIG. 8B is a perspective view showing a magnetic head assembly (head gimbal assembly (HGA)) 400 which forms part of the head stack assembly 390.

As shown in FIG. 8A, the head stack assembly 390 has a bearing portion 380, a head gimbal assembly 400 extending from the bearing portion 380, and a support frame 420 extending from the bearing portion 380 in a direction opposite to the head gimbal assembly 400 and supporting a coil 410 of the voice coil motor.

As shown in FIG. 8B, the head gimbal assembly 400 has an actuator arm 360 extending from the bearing portion 380, and a suspension 350 extending from the actuator arm 360.

A head slider 280 having a magnetic recording head 140 described in the second exemplary embodiment is provided at a front end of the suspension 350.

The magnetic head assembly (head gimbal assembly (HGA)) 400 according to this exemplary embodiment has a magnetic recording head 140 described in the second exemplary embodiment, a head slider 280 in which the magnetic recording head 140 is provided, a suspension 350 having the head slider 280 mounted at one end, and an actuator arm 360 connected to the other end of the suspension 350.

The suspension 350 has lead wire (not shown) for signal writing/reading, for a heater to adjust the floating quantity and for the STO 10. The lead wire is electrically connected to respective electrodes of the magnetic recording head 140 incorporated in the head slider 280. Electrode pads (not shown) are provided in the head gimbal assembly 400. In this exemplary embodiment, eight electrode pads are provided. Two electrode pads are provided for a coil of the main magnetic pole 200, two electrode pads are provided for a magnetic reproducing element 190, two electrode pads are provided for DFH (Dynamic Flying Height) heater, and two electrode pads are provided for the STO 10.

A signal processing portion 385 (not shown) is provided on the back of the magnetic recorder 310 shown in FIG. 7. The signal processing portion 385 performs signal writing/reading into/from the magnetic recording medium 230 by using the magnetic recording head 140. I/O lines of the signal processing portion 385 are connected to the electrode pads of the head gimbal assembly 400 so as to be electrically connected to the magnetic recording head 140.

The magnetic recorder 310 according to this exemplary embodiment has a magnetic recording medium 230, a magnetic recording head 140, a movable portion which can move the magnetic recording medium 230 and the magnetic recording head 140 relatively while confronting them with each other in a state where the magnetic recording medium 230 is separated from or brought into contact with the magnetic recording head 140, a position control portion which aligns the magnetic recording head 140 with a predetermined recording position of the magnetic recording medium 230, and a signal processing portion 385 which performs writing/reading into/from the magnetic recording medium 230 by using the magnetic recording head 140.

A magnetic recording medium 230 is used as the aforementioned magnetic recording medium 230. The aforementioned movable portion can include the head slider 280. The aforementioned position control portion can include the head gimbal assembly 400.

The magnetic recorder 310 has a magnetic recording medium 230, a head gimbal assembly 400, and a signal processing portion 385 which performs signal writing/reading into/from the magnetic recording medium 230 by using the magnetic recording head 140 mounted in the head gimbal assembly 400.

The magnetic recorder 310 can oscillate a high-frequency magnetic field by a small quantity of a driving electron stream 70 (a small quantity of driving current) by using the STO 10 and the magnetic recording head 140. Moreover, by the high-frequency magnetic field oscillation according to this exemplary embodiment, a magnetic recorder capable of achieving high-density magnetic recording can be provided.

In the magnetic recorder 310, the STO 10 can be provided on the leading side of the main magnetic pole 200. In this case, the magnetic recording layer 250 of the magnetic recording medium 230 at operating time first faces the STO 10 and then faces the main magnetic pole 200.

In the magnetic recorder 310, the STO 10 can be provided on the trailing side of the main magnetic pole 200. In this case, the magnetic recording layer 250 of the magnetic recording medium 230 at operating time first faces the main magnetic pole 200 and then faces the STO 10.

Figure 9:
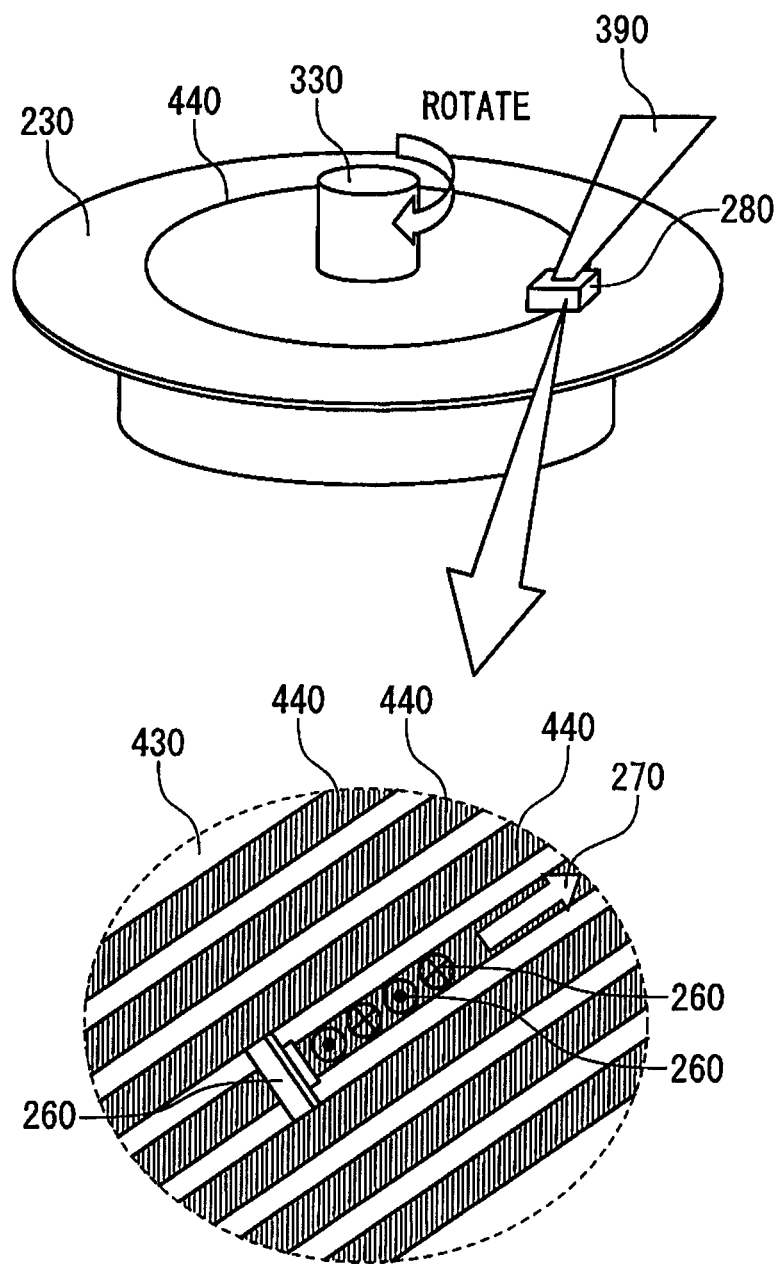
FIG. 9 is a view for explaining a magnetic recording medium according to the third exemplary embodiment.

FIG. 9 is a perspective view showing the configuration of a magnetic recording medium of the magnetic recorder according to this exemplary embodiment.

As shown in FIG. 9, the magnetic recording medium 230 used in the magnetic recorder according to this exemplary embodiment of the invention has multi-grain type magnetic discrete tracks (recording tracks) 440 separated from one another by a nonmagnetic substance (or air) 430 and oriented perpendicularly. When the magnetic recording medium 230 is rotated by the spindle motor 330 and moved toward the medium moving direction 270, any one of the magnetic recording heads 140 described in the second exemplary embodiment is provided so that recording magnetization 260 can be formed.

In this manner, in the magnetic recorder according to the exemplary embodiment of the invention, the magnetic recording medium 230 can be provided as a discrete track medium in which adjacent recording tracks are formed through a nonmagnetic member.

By setting the recording track width-direction width (TS) of the STO 10 to be not smaller than the width (TW) of each recording track 440 and not larger than the recording track pitch (TP), lowering of coercive force of adjacent recording tracks due to a leaking high-frequency magnetic field generated from the STO 10 can be suppressed greatly. Accordingly, in the magnetic recording medium 230 according to this specific example, only the recording track 440 to be recorded can be subjected to high-frequency magnetic field assist recording effectively.

According to this specific example, it is easy to achieve a high-frequency magnetic field assist recording apparatus using narrower tracks, that is, higher track density than use of a so-called "solid film" multi-grain type perpendicular medium. Moreover, by using a high-frequency magnetic field assist recording method and further using a medium magnetic material of high magnetic anisotropic energy (Ku) such as FePt or SmCo unwritable by a conventional magnetic recording head, medium magnetic grains can be made finer up to nano-meter size so that a magnetic recorder of far higher linear recording density than conventional can be achieved even in the recording track direction (bit direction).

According to the magnetic recorder according to this exemplary embodiment, in the discrete magnetic recording medium 230, recording can be performed surely on a magnetic recording layer having high coercive force so that high-density and high-speed magnetic recording can be performed.

Figure 10:
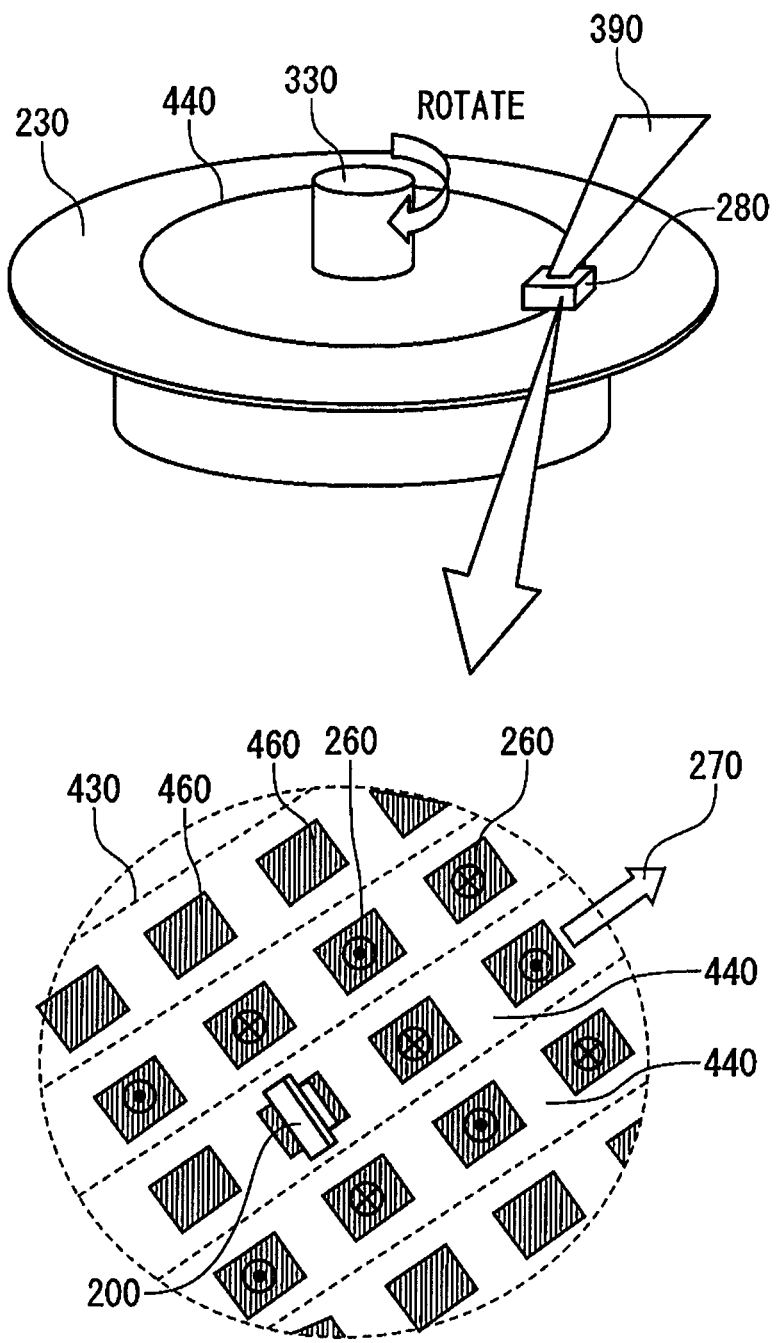
FIG. 10 is a view for explaining a magnetic recording medium according to the third exemplary embodiment.

FIG. 10 is a perspective view showing the configuration of another magnetic recording medium in the magnetic recorder according to this exemplary embodiment.

As shown in FIG. 10, the other magnetic recording medium 230 allowed to be used in the magnetic recorder according to the exemplary embodiment of the invention has magnetic discrete bits 460 separated from one another by a nonmagnetic substance 430. When the magnetic recording medium 230 is rotated by the spindle motor 330 and moved toward the medium moving direction 270, recording magnetization 260 can be formed by the magnetic recording head 140 according to the exemplary embodiment of the invention.

In this manner, in the magnetic recorder according to the exemplary embodiment of the invention, the magnetic recording medium 230 can be provided as a discrete bit medium in which recording magnetic dots isolated through a nonmagnetic member are arranged and formed regularly.

According to the magnetic recorder according to this exemplary embodiment, in the discrete magnetic recording medium 230, recording can be performed surely on a magnetic recording layer having high coercive force so that high-density and high-speed magnetic recording can be performed.

Also in this specific example, by setting the recording track width-direction width (TS) of the STO 10 to be not smaller than the width (TW) of each recording track 440 and not larger than the recording track pitch (TP), lowering of coercive force of adjacent recording tracks due to a leaking high-frequency magnetic field generated from the STO 10 can be suppressed greatly. Accordingly, only the recording track 440 to be recorded can be subjected to high-frequency magnetic field assist recording effectively. When this specific example is used, there is a possibility that a high-frequency magnetic field assist recording apparatus of high recording density not smaller than 10 Tbits/inch$^2$ can be achieved when the magnetic discrete bits 460 are improved in magnetic anisotropic energy (Ku) and miniaturization as long as heat fluctuation resistance can be kept under the use environment.

The invention has been described above specifically based on exemplary embodiments. However, the invention is not limited to these descriptions. Design changes made on the aforementioned exemplary embodiments suitably by those skilled in the art are included in the scope of the invention as long as they have characteristic of the invention. For example, respective constituent members of the exemplary embodiments of the invention and arrangement thereof are not limited to the illustrated examples but can be changed suitably.

Any combination can be made as long as the combination is feasible technically. These combinations are included in the scope of the invention as long as they have characteristic of the invention.

The invention claimed is:

1. A spin torque oscillator comprising:
  a magnetic recording medium;
  a reproducing head;
  a magnetic recording head including:
    a main magnetic pole;
    a first spin injection layer containing a transition metal (TM) alloy;
    a field generation layer containing a TM alloy or a rare earth transition metal (RE-TM) alloy;
    a second spin injection layer containing an RE-TM alloy;
    a first intermediate layer provided between the first spin injection layer and the field generation layer; and
    a second intermediate layer provided between the field generation layer and the second spin injection layer.

2. The spin torque oscillator according to claim 1, wherein:
  the first spin injection layer is an artificial lattice containing a TM alloy.

3. The spin torque oscillator according to claim 1, wherein:
  the field generation layer is a laminated ferri-structure or an artificial lattice containing a TM alloy.

4. The spin torque oscillator according to claim 1, wherein:
  the second spin injection layer is a laminated ferri-structure.

5. The spin torque oscillator according to claim 1, wherein:
  the first spin injection layer, the field generation layer and the second spin injection layer have coercive force weaker than a magnetic field applied from the main magnetic pole.

6. The spin torque oscillator according to claim 1, wherein:
  the RE-TM alloy in the field generation layer or the second spin injection layer is provided so that a magnetization of a rare earth element in the RE-TM alloy is larger than a magnetization of a transition metal in the RE-TM alloy.

7. A magnetic recorder comprising:
a magnetic recording medium;
a reproducing head;
a magnetic recording head including:
   a main magnetic pole;
   a first magnetic layer containing a transition metal (TM) alloy;
   a second magnetic layer containing a TM alloy or a rare earth transition metal (RE-TM) alloy;
   a third magnetic layer containing an RE-TM alloy;
   a first intermediate layer provided between the first magnetic layer and the second magnetic layer; and
   a second intermediate layer provided between the second magnetic layer and the third magnetic layer; and
   a signal processing portion which performs signal writing into the magnetic recording medium by using the magnetic recording head and reading from the magnetic recording medium by using the reproducing head.

8. The magnetic recorder according to claim 7, wherein:
a laminate of the first magnetic layer, the second magnetic layer, the third magnetic layer, the first intermediate layer, and the second intermediate layer is laminated in a direction substantially perpendicular to a medium moving direction.

9. The magnetic recorder according to claim 7, wherein:
a laminate of the first magnetic layer, the second magnetic layer, the third magnetic layer, the first intermediate layer, and the second intermediate layer is laminated in a direction substantially parallel to a medium moving direction.

10. The magnetic recorder according to claim 7, wherein:
the magnetic recording medium is a discrete track medium having adjacent recording tracks formed through a nonmagnetic member.

11. The magnetic recorder according to claim 7, wherein:
the magnetic recording medium is a discrete bit medium having isolated recording magnetic dots arranged and formed regularly through a nonmagnetic member.

* * * * *